United States Patent
Lowenthal et al.

(10) Patent No.: US 9,299,887 B2
(45) Date of Patent: Mar. 29, 2016

(54) ULTRA-THIN PRINTED LED LAYER REMOVED FROM SUBSTRATE

(71) Applicant: Nthdegree Technologies Worldwide Inc., Tempe, AZ (US)

(72) Inventors: Mark David Lowenthal, Gilbert, AZ (US); Jeffrey Baldridge, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/206,985

(22) Filed: Mar. 12, 2014

(65) Prior Publication Data

US 2014/0264396 A1    Sep. 18, 2014

Related U.S. Application Data

(63) Continuation-in-part of application No. 14/177,678, filed on Feb. 11, 2014.

(60) Provisional application No. 61/790,094, filed on Mar. 15, 2013.

(51) Int. Cl.
*H01L 33/62* (2010.01)
*H01L 25/04* (2014.01)
(Continued)

(52) U.S. Cl.
CPC ............ *H01L 33/08* (2013.01); *H01L 25/0753* (2013.01); *F21K 9/00* (2013.01);
(Continued)

(58) Field of Classification Search
CPC ... H01L 25/0753; H01L 25/167; H01L 33/50; H01L 33/507; H01L 33/42; H01L 33/44; H01L 33/505; H01L 33/483; H01L 33/502; H01L 33/60; H01L 27/153–27/156; H01L 33/62; F21K 9/00; F21Y 2101/02; F21Y 2103/003; G02F 1/133603
See application file for complete search history.

(56) References Cited

U.S. PATENT DOCUMENTS

2005/0212406 A1* 9/2005 Daniels .................... F21K 9/00
 313/503
2005/0233504 A1* 10/2005 Doi ..................... H01L 21/6835
 438/127
(Continued)

FOREIGN PATENT DOCUMENTS

WO    2007149362 A2    12/2007
WO    2012031178 A2    3/2012

OTHER PUBLICATIONS

PCT/US2014/026249, International Search Report and Written Opinion, dated Sep. 26, 2014, 12 pages.
(Continued)

*Primary Examiner* — Marvin Payen
*Assistant Examiner* — Jeremy Joy
(74) *Attorney, Agent, or Firm* — Patent Law Group LLP; Brian D. Ogonowksy

(57) ABSTRACT

Ultra-thin flexible LED lamp layers are formed over a release layer on a substrate. The LED lamp layers include a first conductor layer overlying the release layer, an array of vertical light emitting diodes (VLEDs) printed over the first conductor layer, where the VLEDs have a bottom electrode electrically contacting the first conductor layer, and a second conductor layer overlying the VLEDs and contacting a top electrode of the VLEDs. Other layers may be formed, such as protective layers, reflective layers, and phosphor layers. The LED lamp layers are then peeled off the substrate, wherein the release layer provides a weak adherence between the substrate and the LED lamp layers to allow the LED lamp layers to be separated from the substrate without damage. The resulting LED lamp layers are extremely flexible, enabling the LED lamp layers to be adhered to flexible target surfaces including clothing.

18 Claims, 3 Drawing Sheets

(51) Int. Cl.
*H01L 33/08* (2010.01)
*H01L 25/075* (2006.01)
*F21Y 103/00* (2006.01)
*F21Y 101/02* (2006.01)
*F21K 99/00* (2010.01)
*G02F 1/1335* (2006.01)
*H01L 23/00* (2006.01)

(52) U.S. Cl.
CPC ....... *F21Y 2101/02* (2013.01); *F21Y 2103/003* (2013.01); *G02F 1/133603* (2013.01); *H01L 24/95* (2013.01); *H01L 33/62* (2013.01); *H01L 2221/68381* (2013.01); *H01L 2224/95085* (2013.01); *H01L 2224/95101* (2013.01); *H01L 2924/1033* (2013.01); *H01L 2924/12041* (2013.01)

(56) References Cited

U.S. PATENT DOCUMENTS

| | | | |
|---|---|---|---|
| 2005/0265029 A1 | 12/2005 | Epstein et al. | |
| 2007/0290217 A1* | 12/2007 | Daniels | G02F 1/133603 257/88 |
| 2008/0191220 A1* | 8/2008 | Daniels | H01L 24/29 257/88 |
| 2009/0114928 A1* | 5/2009 | Messere | B32B 17/10 257/88 |
| 2009/0173954 A1* | 7/2009 | Beeson | H01L 25/0753 257/88 |
| 2011/0223368 A1* | 9/2011 | Zietlow et al. | 428/42.1 |
| 2012/0181571 A1* | 7/2012 | Park | H01L 24/27 257/99 |
| 2013/0062633 A1* | 3/2013 | Demuynck | H01L 25/0753 257/88 |
| 2014/0209945 A1* | 7/2014 | Baldridge | H01L 25/0753 257/91 |
| 2014/0340900 A1* | 11/2014 | Bathurst | F21K 9/00 362/249.02 |

OTHER PUBLICATIONS

Lowenthal et al., "Transparent LED Layer Between Phosphor Layer and Light Exit Surface of Lamp", Unpublished U.S. Appl. No. 14/177,678, filed Feb. 11, 2014.

Lowenthal et al., "Ultra-Thin Substrateless Micro-LED Based Printed Lamp", Unpublished U.S. Appl. No. 61/790,094, filed Mar. 15, 2013.

* cited by examiner

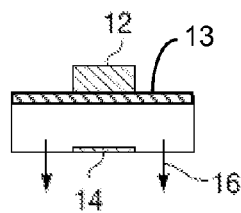
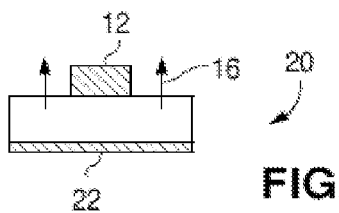
FIG. 1  FIG. 2
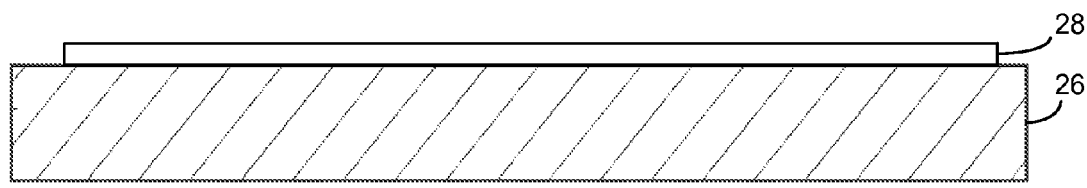
FIG. 3
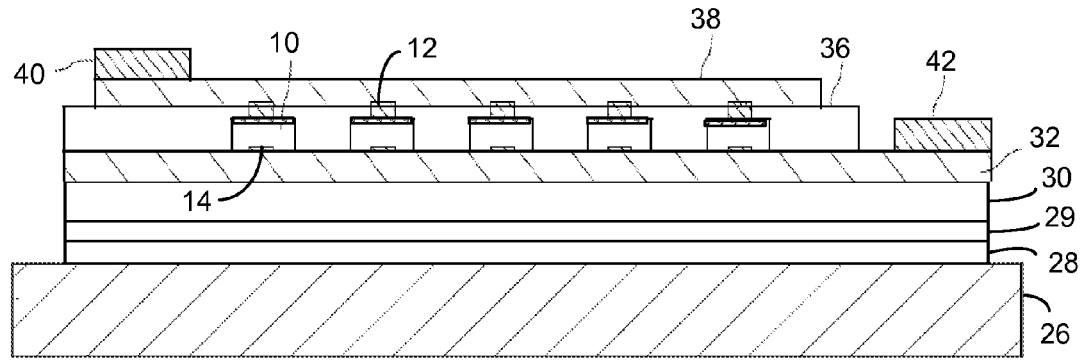
FIG. 4A
FIG. 4B

ULTRA-THIN PRINTED LED LAYER REMOVED FROM SUBSTRATE

CROSS-REFERENCE TO RELATED APPLICATIONS

This application is a continuation-in-part of U.S. application Ser. No. 14/177,678, filed on Feb. 11, 2014, by Mark David Lowenthal et al., and is also based on U.S. provisional application Ser. No. 61/790,094, filed Mar. 15, 2013, by Mark David Lowenthal et al., both applications assigned to the present assignee and incorporated herein by reference.

FIELD OF THE INVENTION

This invention relates to printing a layer of light emitting diodes (LEDs) and conductors over a substrate and then removing the substrate to form an ultra-thin LED lamp.

BACKGROUND

It is known by the Applicant's previous work to print a conductor layer over a flexible substrate, followed by printing a monolayer of microscopic vertical LEDs over the conductor layer in the desired orientation so that bottom electrodes of the LEDs ohmically contact the conductor layer. A dielectric layer is then printed over the conductor layer, followed by printing a transparent conductor layer to contact the top electrodes of the LEDs and connect the LEDs in parallel. A layer of phosphor may be optionally printed over the LEDs to wavelength-convert the LED light. When a sufficient voltage is applied to the conductor layers, the LEDs emit light through the transparent conductor layer. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

The thickness of the substrate may exceed 250 microns. The thickness of the combined LED/conductors layers may be as thin as 20 microns. If the phosphor layer were included, the thickness of the LED/conductor/phosphor layers may be around 60 microns.

The resulting LED lamp is flexible to a certain radius. However, the flexibility is limited by the substrate, which is more rigid than the LED/conductor layers, and stresses created by the different radii of the substrate and LED/conductor layers when bending could stretch or tear the LED/conductor layers, possibly destroying the lamp. Further, in some applications of the lamp, such as for laminating the lamp to an article of clothing, the substrate causes the lamp to be much stiffer than the clothing and causes the overall thickness of the lamp to be problematic.

Additionally, since the substrate remains on the final LED lamp product, the substrate should be optimized for the final product rather than optimized for the manufacturing process, such as a roll-to roll process. Therefore, there is a trade-off between optimizing manufacturability and optimizing the final product. The substrate also adds cost to the final product.

What is needed is a technique for forming a printed LED lamp that does not suffer from the issues described above relating to the substrate.

SUMMARY

A flexible or rigid substrate is initially provided for forming a printed LED lamp. If the printing process is a roll-to-roll process, the substrate will be a flexible film, such as polycarbonate. Since the invention is directed to releasing the LED lamp layers from the substrate, the substrate can be optimized for use in a roll-to-roll process, rather than being optimized for the final lamp product, and can have any thickness. The substrate can be reused to reduce material costs.

Over the substrate is printed a release layer. The release layer relatively strongly adheres to the substrate, but only weakly adheres to the subsequent printed LED lamp layers forming the LED lamp. Instead of printing the release layer, the release layer may be laminated onto the substrate.

In one embodiment, the LED lamp layer does not chemically adhere to the release layer but is only secured by a vacuum or static adhesion between the smooth release layer and the smooth LED lamp layer.

In another embodiment, the release layer is very thin, such as less than 60 microns, and only weakly adheres to the substrate while more strongly adhering to the LED lamp layer. The release layer then remains on the LED lamp after the substrate is removed and may serve as a protective layer.

For an LED lamp where light is intended to be emitted from the top surface, a bottom conductor layer, the LED layer, a dielectric layer, and a top transparent conductor layer are then printed over the release layer to form the LED lamp layers. If light is intended to be emitted from the bottom surface, the LEDs are printed over a transparent conductor layer.

After curing, the LED lamp layers are peeled off the substrate or removed by a vacuum. Depending on the characteristics of the release layer, the release may be performed by applying heat or just pulling the LED lamp layers away from the substrate using physical force. This is a simple technique in a roll-to-roll process, where the flexible LED lamp layers are taken up by a rotating LED lamp roller, and the separated flexible substrate is taken up by a separate rotating substrate roller. The substrate with the release layer may be reused.

If the LED lamp layers are to be laminated and strongly adhered to its target surface, such as an article of clothing, the lamination may occur at the same time that the substrate is pulled away from the LED lamp layers. In such a case, the top surface of the LED lamp layers, while on the substrate, is adhered to the target surface prior to the separation. Therefore, in such a case, the LED lamp layers are designed so the light emission is from the bottom surface of the LED lamp layers, opposite to the target surface. The LED lamp layers may be made substantially transparent.

A phosphor layer or layer of quantum dots or dyes may be used to wavelength-convert the LED light.

Various other embodiments are described.

BRIEF DESCRIPTION OF THE DRAWINGS

FIG. 1 is a cross-sectional view of a vertical LED designed to only emit light from its bottom surface and side surfaces.

FIG. 2 is a cross-sectional view of a vertical LED designed to only emit light from its top surface and side surfaces.

FIG. 3 is a cross-sectional view of a starting substrate having a release layer deposited on its surface.

FIG. 4A is a cross-sectional view of one embodiment of the LED lamp prior to the substrate being removed from the LED lamp layers.

FIG. 4B is a top down view of the structure of FIG. 4A, where FIG. 4A is taken across a horizontally bisected FIG. 4B.

Elements that are similar or identical in the various figures are labeled with the same numeral.

DETAILED DESCRIPTION

Figure 5:
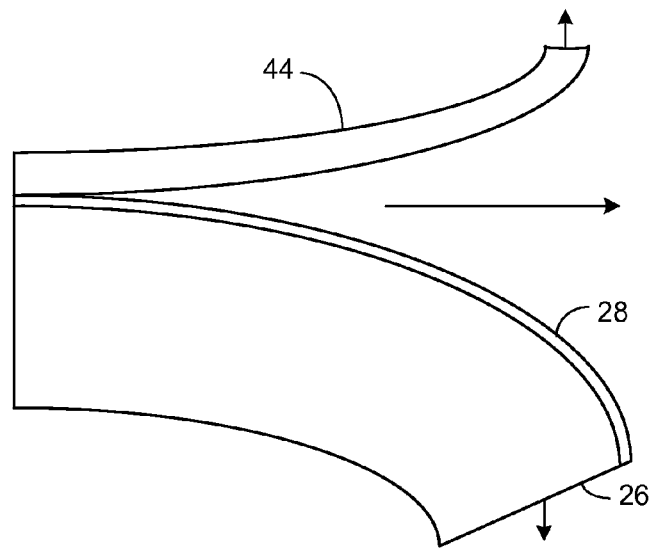
FIG. 5 illustrates the completed LED lamp layers and the substrate being separated.

The GaN-based micro-LEDs used in embodiments of the present invention are less than a third the diameter of a human hair and less than a tenth as high, rendering them essentially invisible to the naked eye when the LEDs are sparsely spread across a substrate. The sizes of the devices may range from about 10-200 microns across. This attribute permits construction of a nearly or partially transparent light-generating layer made with micro-LEDs. The number of micro-LED devices per unit area may be freely adjusted when applying the micro-LEDs to the substrate. A well dispersed random distribution across the surface can produce nearly any desirable surface brightness. Lamps well in excess of 10,000 cd/m$^2$ have been demonstrated by the assignee. The LEDs may be printed as an ink using screen printing, flexography, or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

FIG. 1 is a cross-sectional view of a vertical LED 10 (VLED) that may be used in the invention. The LED 10 includes standard semiconductor GaN layers, including an n-layer, an active layer (e.g., multi-well layers), and a p-layer. The LED 10 is a heterojunction LED.

In one embodiment, an LED wafer, containing many thousands of vertical LEDs, is fabricated so that the top metal anode electrode 12 for each LED includes a reflective layer 13 (a mirror) over the top anode surface of the LED 10. The reflective layer 13 should have a reflectivity of over 90% for visible light. The bottom metal cathode electrode 14 for each LED, also reflective, is small to allow almost all the LED light to escape the cathode side. There is some side light, depending on the thickness of the LED. The anode and cathode surfaces may be opposite to those shown.

The LEDs are completely formed on the wafer, including the anode and cathode metallizations, by using one or more carrier wafers, bonded to the LED wafer by an adhesive layer, during the processing and removing the growth substrate to gain access to both LED surfaces for metallization. After the LEDs are formed on the wafer, trenches are photolithographically defined and etched in the front surface of the wafer around each LED, to a depth equal to the adhesive layer, so that each LED has a diameter of less than 50 microns and a thickness of about 4-8 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are singulated. The LEDs of FIG. 1 or FIG. 2 result, depending on the metallization designs. The microscopic LEDs are then uniformly infused in a solvent, including a viscosity-modifying polymer resin, to form an LED ink for printing, such as screen printing or flexographic printing.

The LEDs may instead be formed using many other techniques and may be much larger or smaller. The lamps described herein may be constructed by techniques other than printing.

In FIG. 1, the cathode electrode 14 only uses up about 10-30% of the surface area of the LED 10. Even coverage up to 50% is adequate due to the reflectiveness of the reflective layer 13 and the electrode 14. A transparent conductor layer over the cathode semiconductor surface may be used to spread current from the cathode electrode 14.

Since there is no blockage of light around the electrode 14, and the active layer emits light in both directions, light rays 16 are emitted primarily from the bottom surface of the bare LED 10. Optionally, the bottom cathode electrode 14 may be completely omitted and replaced with a transparent conductor, such as ITO.

The surfaces of the LED 10 may be roughened by etching to increase light extraction (i.e., decrease internal reflections).

If it is desired for the anode electrodes 12 to be oriented in a direction opposite to the substrate after printing, the electrodes 12 are made tall so that the LEDs 10 are rotated in the solvent, by fluid pressure, as they settle on the substrate surface. The LEDs rotate to an orientation of least resistance. Over 90% like orientation has been achieved, although satisfactory performance may be achieved with over 75% of the LEDs being in the same orientation.

The LED 20 of FIG. 2 is identical to the LED 10 except a reflective cathode electrode 22 extends over the entire bottom surface of the LED 20. The light rays 16 thus exit through the anode side. The LEDs 10 are used in the embodiment of FIGS. 4A and 5, and the LEDs 20 are used in the embodiment of FIG. 7.

In FIG. 3, a starting substrate 26 is provided. The substrate 26 may be opaque, transparent, or semi-transparent and is preferably thin for light weight, low cost, and ease of processing. The substrate 26 may be a suitable polymer, such as polycarbonate, PMMA, or PET, and may be dispensed from a roll. The substrate 26 may even be a coated paper or cloth. The substrate 26 can be any size, since no vacuum processing is needed for fabrication of the lamp and the processing may be performed using a conveyor system. The substrate 26 may be optimized for the process, rather than the final product, since it is not part of the final product.

A thin release layer 28 is then printed over the substrate 26. In one embodiment, the release layer 28 adheres strongly to the substrate 26 and adheres weakly to the LED lamp layers. More specifically, the LED lamp layer inks poorly adhere to the cured release layer 28 ink because of surface energy mismatch. The release layer 28 adheres more strongly to the substrate 26 because of better matched surface energies of the two materials. Other mechanisms for the differences in adhesion may apply depending on the release layer material used.

In one embodiment, the release layer 28 may be a printable varnish from MacDermid Autotype Ltd. The "print and peel" varnish is water based and can be printed on a variety of substrates, such as PET, PEN, polycarbonate, etc. The procedure may be as follows. The varnish layer is printed on the substrate 26, such as to a thickness between 6-15 microns and cured by heat. The LED lamp layers are then printed on the varnish layer, as described below. After the lamp is completed, the lamp can be peeled away from the varnish layer, to which it does not adhere well. The released LED lamp layers are composed of only the inks used to print the lamp. The varnish layer remains on the substrate 26. If any of the varnish layer sticks to the lamp layers, rather than the substrate 26, after the lamp layers are peeled off, the residue may be washed away with a damp sponge, since the varnish is highly soluble in water.

In another embodiment, the release layer 28 easily peels off the substrate 26 and remains on the LED lamp layers after peeling. In one embodiment a thermoplastic polyurethane (TPU) liner film (as the release layer 28) is printed on PET film, acting as the substrate 26. In one embodiment, the TPU film is between 10 and 100 microns thick and the substrate 26 is at least 175 microns thick. The LED lamp layers are then printed over the TPU film. The TPU film and the LED lamp layers are then peeled from the substrate 26. The thin TPU film remaining on the LED lamp layers acts as a protective layer.

The release layer 28 may be transparent or opaque. Many types of suitable release layer materials are commercially available. In another embodiment, the release layer 28 only adheres by the vacuum formed between the opposing smooth surfaces or adheres by static adhesion.

The release layer 28 may be applied and cured during a roll-to-roll process.

The release layer 28 may consist of a plurality of layers, and some layers may remain on the substrate 26 while other layers may remain on the LED lamp layers.

If light exits through the side of the LED lamp layers that faced the substrate 26, removing the LED lamp layers from the substrate 26 may also improve light extraction if the index of refraction of the substrate 26 is high relative to that of air.

The following examples of the LED lamp layers are independent of the release layer 28, and many different embodiments of the LED lamp layers may be used in accordance with the present invention. FIGS. 4A-8 are just examples and are not limiting.

As shown in FIG. 4A, a reflector layer 29 is deposited on the release layer 28 such as by printing. The reflector layer 29 may be a specular film, such as a reflective metal, or may be a diffusing white layer.

An optional phosphor layer 30 is then deposited, such as by screen printing or by flexography, over the reflector layer 29. If the LEDs 10 emit blue light, the phosphor layer 30 may be a combination of YAG (yellow) phosphor and, optionally, red phosphor in a polymer binder to create white light, where the red phosphor creates a warmer white light. Any colors can be created by other combinations of phosphors. Other wavelength-conversion materials may be used instead, such as quantum dots or dyes.

An optional transparent stand-off layer may be formed that separates the LED layer from the phosphor layer 30. By separating the LEDs from the reflective surface and the phosphor layer 30, less light will impinge upon the LEDs and be absorbed by the LEDs.

On top of the phosphor layer 30 (or stand-off layer) is deposited a transparent conductor layer 32, such as an indium-tin-oxide (ITO) layer or a layer containing silver nanofibers. The conductor layer 32 may have a conductivity of 1 to 100 ohms/square, which is adequate for short spans with a low current. If the resistivity is too high due to the width of the light sheet, thin metal runners may be printed across the width and connected to one or more perpendicular metal bus bars to create a more uniform voltage across the conductor layer 32.

The LEDs 10 are then printed on the conductor layer 32 such as by flexography or by screen printing with a suitable mesh to allow the LEDs to pass through and control the thickness of the layer. Because of the comparatively low concentration, the LEDs 10 will be printed as a loose monolayer and be fairly uniformly distributed over the conductor layer 32. Any other suitable deposition process may be used. In the example of FIG. 4A, the top anode electrodes 12 are formed to be relatively tall so that the LEDs 10 orient themselves in the direction shown in FIG. 4A by taking the rotational orientation of least resistance when settling on the surface of the conductor layer 32. By proper construction of the top electrode, over 90% of the LEDs 10 can be oriented with their anodes up.

The solvent is then evaporated by heat using, for example, an infrared oven. After curing, the LEDs 10 remain attached to the underlying transparent conductor layer 32 with a small amount of residual resin that was dissolved in the LED ink as a viscosity modifier. The adhesive properties of the resin and the decrease in volume of resin underneath the LEDs 10 during curing press the bottom LED electrode 14 against the underlying transparent conductor 32, making ohmic contact with it.

A transparent dielectric layer 36 is then selectively printed over the surface to encapsulate the LEDs 10 and additionally secure them in position without covering at least one edge of the conductor layer 32. The ink used in the dielectric layer 36 is designed to pull back or de-wet from the upper surface of the LEDs 10 during curing to expose the top anode electrodes 12.

A top transparent conductor layer 38 is then printed over the dielectric layer 36 to electrically contact the electrodes 12 and is cured in an oven appropriate for the type of transparent conductor being used.

Metal bus bars 40 and 42 are then printed along opposite edges of the transparent conductor layers 38 and 32 and electrically terminate at anode and cathode leads (not shown), respectively. If the bus bar ink is solvent based, it may be cured in an oven. If it is a radiation cured silver, it may be cured by exposing it to a UV light or electron beam curing system. The bus bars 40/42 will ultimately be connected to a power source using a connector appropriate for the particular application.

The points of connection between the bus bars 40/42 and the power source leads may be at opposite corners of each bus bar 40/42 for uniform current distribution along each bus bar 40/42 or may be at multiple points along each bus bar 40/42 to reduce the voltage drop across the bus bar 40/42, for large light sheets, to improve electrical efficiency.

If a suitable voltage differential is applied to the anode and cathode leads, all the LEDs 10 with the proper orientation will be illuminated.

As the light sheet width is increased, the voltage differential near the middle of the transparent conductor layers 32 and 38 will be lessened due to the resistivity of the conductor layers. As a result, the middle LEDs 10 may not be as bright as the LEDs nearer the edge.

The configuration of the bus bars 40/42 in FIGS. 4A and 4B compensates for such resistivity in the conductor layers 32/38. One metal bus bar 40 is formed along only one edge of the top transparent conductor layer 38, and another metal bus bar 42 is formed along one edge of the bottom transparent conductor layer 32.

FIG. 4B shows how the voltage V1 applied to the bus bar 40 spreads across the top conductor layer 38 and the voltage V2 applied to the bus bar 42 spreads across the bottom conductor layer 32. If we assume the voltage applied to the bus bar 40 is +3V and the voltage applied to the bus bar 42 is −3V, the voltage along the top conductor layer 38 will be reduced to, for example, +2V at the opposite end of the conductor layer 38 due to Ohms law. Similarly, the voltage along the bottom conductor layer 32 will approach ground and be, for example, −2V at the opposite end of the conductor layer 32 due to Ohms law. Along the length of the conductor layers 32/38, however, the differential voltage normal to the layers will be a constant 5 V, sufficient to turn on the LEDs 10, because of the 2 to 3 orders of magnitude lower resistance of the bus bars 40 and 42 relative to the conductor layers 38 and 32 The voltages may be controlled by a current regulator. As long as there is both a much lower resistance in bus bars 40 and 42 relative to the transparent conductor layers 38 and 32 and the transparent conductor layers 38 and 32 have matching impedances, uniform current density and therefore LED brightness can be maintained across the entire surface of the lamp.

In another embodiment, not shown, an equal potential is supplied over both conductor layers 38/32 by horizontal metal runners (e.g., traces) along each of the conductor layers 38/32. The metal runners on the conductor layers 38/32 should not overlie each other, and the runners on the conductor layer 38 should be widely laterally spaced from the runners on the conductor layer 32 to achieve a substantially constant voltage differential at all points between the conductor layers 38/32. Optionally, a bus bar may be formed along both edges of each conductor layer and connected to the anode or cathode lead for even more uniform potential in embodiments where the light sheet is large and there are high currents conducted.

FIG. 5 illustrates the LED lamp layers 44 being pulled off the release layer 28, such as by take-up rollers rotating in opposite directions in a roll-to-roll fabrication process, without damage to the LED lamp layers 44. In such a roll-to-roll process, the substrate 26 is continuous and provided on a roll. An upper take-up roller rolls up the flexible LED lamp layers 44, and a lower take-up roller rolls up the substrate 26 and release layer 28 for possible reuse. The various arrows in FIG. 5 indicate the pulling apart of the LED lamp layers 44 and the substrate 26 and the direction of the process flow.

The resulting LED lamp layers 44 may be substantially transparent if no reflector layer is used.

In one embodiment, the target material, such as a cloth, is provided on the take up roller, and an adhesive is applied to the top surface of the LED lamp layers 44 or to the cloth. The cloth and LED lamp layers are then pressed together to affix them. As the take-up roller rotates, the cloth pulls the LED lamp layers 44 away from the substrate, leaving only the LED lamp layers 44 on the cloth surface. In that case, the LED lamp layers 44 are designed so that light exits the lamp though the surface opposite to the cloth. Gaps may be provided around the lamp's electrodes for connection to a power source. In one embodiment, the mounting of the LED lamp layers 44 to the target surface aligns the lamp's electrodes to an electrical connector on the target surface. Such adhesives may be pressure sensitive, heat activated, chemically activated, light activated, or use other activation techniques. The LED lamp layer 44 and the target material may be later singulated from the take-up roller. In another embodiment, the LED lamp layers 44 may be affixed to a rigid flat panel or on any other surface after being singulated. The singulated LED lamp layer 44 need not be mounted on any other surface, depending on the particular application.

In another embodiment, the LED lamp layers 44 may be affixed to the target surface without an adhesive. For example, the LED lamp layers 44 may be affixed to a target surface by an overlying transparent laminated sheet or encased in a transparent molded package. The package allows access to the LED lamp electrodes.

In one embodiment, the LED lamp layer 44 has additional layers, such as moisture proof layers or resilient layers, that further protect the LED lamp layers 44 and/or allow the resulting structure to be bent without stressing the LED lamp layers 44.

The power source for the LEDs may be supplied directly to the conductor layers, or the conductor layers may be connected in series with an integrated inductive loop antenna which converts a magnetic field to the current needed to drive the LEDs, even as pulses. A pulsed LED layer may serve as a nighttime safety feature in clothing.

In another embodiment, the release layer 28 does not have to be a continuous layer but represents any amount of material that is used to reduce the adhesion between the LED lamp layers and the substrate. Any amount of such material between the substrate 26 and the LED lamp layers is referred to as a release layer.

Figure 6:
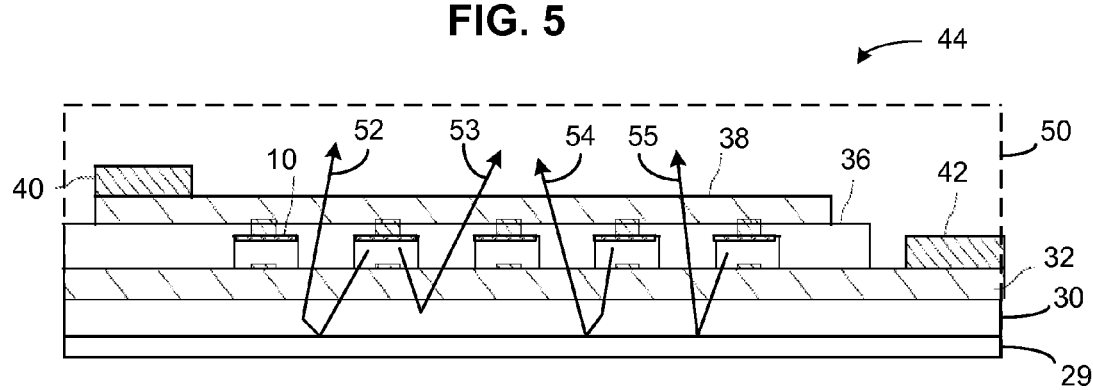
FIG. 6 illustrates the lamp of FIG. 4A, after the substrate has been removed, where a phosphor layer is below the LED layer, and light exits through the transparent top conductor layer.

FIG. 6 illustrates the LED lamp layers 44 of FIGS. 4A/5, after the substrate has been removed, showing the different paths of various possible light rays. FIG. 6 also shows an optional protective transparent layer 50 formed over the structure, prior to separation from the release layer 28, for protection and increased light extraction. A second protective layer (not shown) may be formed over the release layer 28 in FIG. 4A for protecting the bottom surface of the LED lamp layers 44. The protective layers may be formed of a semi-resilient material, unlike the substrate 26, so that there is less stress on the LED/conductor layers if the lamp is flexed. The protective layers may be made very thin.

The LEDs 10 are shown much larger relative to the remaining structures then they would be in an actual embodiment for ease of understanding and are shown much closer together than they would be in an actual embodiment. Therefore, there is little blockage of reflected light by the LEDs 10.

The light ray 52 exits the bottom of the LED 10, passes through the phosphor layer 30 unabsorbed, and reflects off the reflector layer 29. On the way back through the phosphor layer 30, the light ray 52 is absorbed by a phosphor particle and converted to the phosphor wavelength, such as yellow. Therefore, the LED light has an increased probability of being converted by the phosphor layer 30. Thus, less phosphor is needed, relative to a lamp with phosphor between the viewer and the LEDs, in order to achieve a given color temperature.

The light ray 53 exits the bottom of the LED 10 and is directly absorbed by a phosphor particle and converted to the phosphor wavelength. The phosphor particle happens to emit the light in the direction of the exit window of the lamp.

The light ray 54 exits the bottom of the LED 10 and is directly absorbed by a phosphor particle and converted to the phosphor wavelength. The phosphor particle happens to emit the light in the direction of the reflector layer 29. The reflector layer 29 then reflects the light out of the lamp.

The light ray 55 exits the bottom of the LED 10, passes through the phosphor layer 30 unabsorbed, and reflects off the reflector layer 29. On the way back through the phosphor layer 30, the light ray 55 again passes through the phosphor layer 30 unabsorbed and exits the lamp as blue light.

The blue light exiting the sidewalls of the LEDs 10 exits the lamp without conversion or gets converted by the phosphor layer 30. Such light is widely dispersed throughout the lamp and helps to create a more uniform color across the lamp.

Since there is no blue light directly emitted from the top surfaces of the LEDs 10, there are no blue hot spots perceivable, improving color uniformity.

To further increase color uniformity and efficiency, a transparent spacer layer (also referred to as a stand-off layer) may be deposited between the transparent conductor layer 32 and the phosphor layer 30. This allows the LED light to be more widely diffused prior to energizing the phosphor layer 30 or reflecting off the reflector layer 29, resulting in even better color uniformity across the lamp. Further, by separating the LEDs from the phosphor layer and reflector layer, there is less probability that a reflected or re-emitted light ray will be absorbed by the nearest LED, increasing the efficiency of the lamp. Alternatively, the phosphor layer 30 may be made thicker by adding more binder.

Further, by making the reflector layer 29 diffusively reflective, such as a white layer, the reflected light will be redirected away from the nearest LED and not be absorbed by the LED.

The phosphor layer 30 may be replaced by other wavelength-conversion materials such as quantum dots or dyes.

The reflective layer 29 may be adhered to a target surface, such as an article of clothing, a panel, or other surface.

In another embodiment, the reflector layer 29 is eliminated and the light exits the bottom surface. This is useful when the top surface of the LED lamp layers 44 is affixed to a target surface, such as an article of clothing. Since the LED lamp layers 44 may be transparent, the underlying cloth is visible through the LED lamp layers 44.

Figure 7:
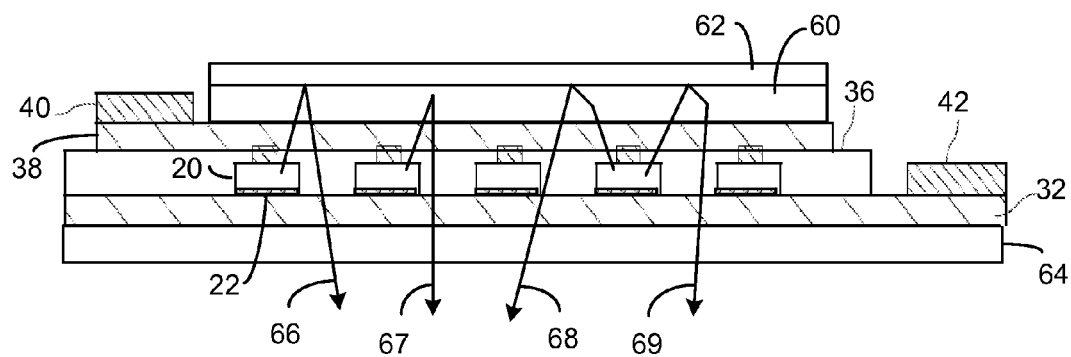
FIG. 7 is a cross-sectional view of another embodiment of the inventive lamp, after the substrate has been removed, where the phosphor layer overlies the LED layer and light exits through the transparent bottom conductor layer.

FIG. 7 illustrates a lamp where the LEDs 20 from FIG. 2 are used, and the orientation of the LEDs 20 is the same as in FIG. 6. In FIG. 7, the LEDs 20 primarily emit their blue light upward. Therefore, the phosphor layer 60 is overlying the top transparent conductor layer 38, and the reflector layer 62 overlies the phosphor layer 60. The reflector layer 62 may be specular or diffusive, such as white. A thin transparent protective layer 64, formed over the release layer (not shown), protects the device, such as from moisture. The remaining layers, processes, and the various alternatives may be the same as those described above.

In FIG. 7, the light ray 66 exits the top of the LED 20, passes through the phosphor layer 60 unabsorbed, and reflects off the reflector layer 62. On the way back through the phosphor layer 60, the light ray 66 again passes through the phosphor layer 60 unabsorbed and exits the lamp as blue light.

The light ray 67 exits the top of the LED 20 and is directly absorbed by a phosphor particle and converted to the phosphor wavelength. The phosphor particle happens to emit the light in the direction of the exit window of the lamp.

The light ray 68 exits the top of the LED 20 and is directly absorbed by a phosphor particle and converted to the phosphor wavelength. The phosphor particle happens to emit the light in the direction of the reflector layer 62. The reflector layer 62 then reflects the light out of the lamp.

The light ray 69 exits the top of the LED 20, passes through the phosphor layer 60 unabsorbed, and reflects off the reflector layer 62. On the way back through the phosphor layer 60, the light ray 69 is absorbed by a phosphor particle and converted to the phosphor wavelength. Therefore, the LED light has an increased probability of being converted by the phosphor layer 60. Thus, less phosphor is needed, relative to a lamp with phosphor between the viewer and the LEDs, in order to achieve a given color temperature.

The lamp of FIG. 7 has the same beneficial attributes as the lamp of FIG. 6, where color uniformity is improved and less phosphor is needed.

The reflective layer 62 may be adhered to a target surface, such as an article of clothing, a panel, or other surface.

Figure 8:
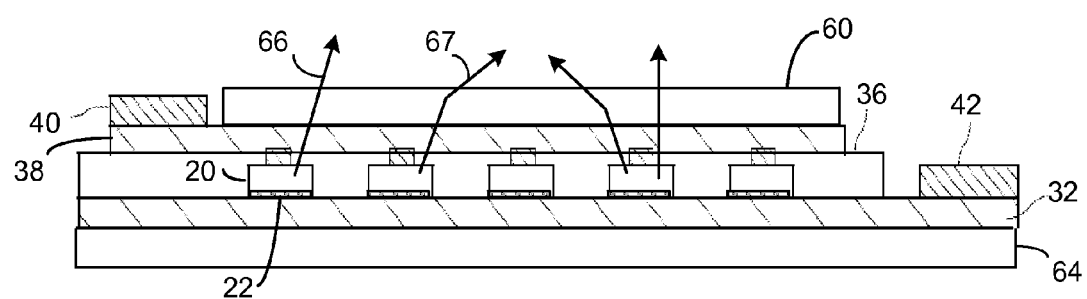
FIG. 8 is similar to FIG. 7, except the top reflector layer is not formed and the light exits through the top layers.

FIG. 8 illustrates the lamp of FIG. 7 except the reflector layer 62 is not formed, allowing the LED light (rays 66, 67) to exit the top surface. The bottom conductor layer 32 and the protective layer 64 may be transparent or opaque. A reflector layer may be added to the bottom surface. The layer 64 may be adhered to a target surface, such as an article of clothing, a panel, or other surface. Alternatively, the layer 64 itself may represent the target surface on which the LED lamp layers are affixed. If the various layers are transparent, the target surface is visible through the LED lamp layers.

The resulting LED lamp layers without the phosphor layer may be as thin as 20 microns. The phosphor layer may add 30 microns or more. Since the phosphor layer may be printed as phosphor particles in a resilient binder, the phosphor layer is flexible.

The various figures may represent the entire lamp or just a small, repeated section of the lamp. The sections may be connected in any combination of series and/or parallel. In one embodiment, the LEDs and conductors are printed as strips over a thin protective layer. The LEDs in a single strip are connected in parallel by the conductors. A pattern of conductors between the strips can then connect the strips in any combination of series and parallel to achieve the desired electrical characteristics.

Additional layers of VLEDs may be stacked, with a transparent conductor in-between, to form VLEDs connected in a combination of series and parallel.

All layers of the lamps may be formed by printing in atmospheric conditions with simple equipment and without any precision alignment and pick-and-place mechanisms. The light sheet is flexible without any danger of delamination when flexed and is very thin and light.

The light sheet may be laminated on any surface, including windows and clothes/fabrics, or be patterned to create alpha-numeric signs or other displays. The light sheet may even be foldable or crumpled. The light sheet may be supported by a simple frame and hung from a ceiling or used in other ways. The light sheet can be bent, such as in a U-shape or a V-shape to contour to curved walls or to create various emission profiles. The light sheets can be used for general illumination, safety lights, displays, backlights, indicator lights, etc.

Diffusion layers or brightness enhancement layers may be printed on or laminated on the light sheet exit surface to modify the light emission pattern and avoid glare.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of forming an illumination structure comprising:
   providing a substrate;
   providing a release layer overlying the substrate;
   forming a first conductor layer overlying the release layer;
   depositing an array of vertical light emitting diodes (VLEDs) over the first conductor layer, the VLEDs having a bottom electrode electrically contacting the first conductor layer;
   forming a second conductor layer overlying the VLEDs, the VLEDs having a top electrode electrically contacting the second conductor layer, wherein the first conductor layer, the VLEDs and the second conductor layer comprise flexible LED lamp layers; and
   removing the LED lamp layers from the substrate, wherein the release layer provides an adherence between the substrate and the LED lamp layers to allow the LED lamp layers to be separated from the substrate without damage, wherein a surface of the LED lamp layers opposing the substrate is a bottom surface and a surface of the LED lamp layers facing away from the substrate is a top surface, the method further comprising adhering the bottom surface of the LED lamp layers to a target surface after removing the LED lamp layers from the substrate, wherein light exits the top surface of the LED lamp layers.

2. A method of forming an illumination structure comprising:
providing a substrate;
providing a release layer overlying the substrate;
forming a first conductor layer overlying the release layer;
depositing an array of vertical light emitting diodes (VLEDs) over the first conductor layer, the VLEDs having a bottom electrode electrically contacting the first conductor layer;
forming a second conductor layer overlying the VLEDs, the VLEDs having a top electrode electrically contacting the second conductor layer, wherein the first conductor layer, the VLEDs and the second conductor layer comprise flexible LED lamp layers;
removing the LED lamp layers from the substrate, wherein the release layer provides an adherence between the substrate and the LED lamp layers to allow the LED lamp layers to be separated from the substrate without damage; and
at least one intermediate layer between the release layer and the first conductor layer.

3. The method of claim 1 wherein at least one of the first conductor layer or the second conductor layer is transparent to allow light from the VLEDs to pass through.

4. The method of claim 1 further comprising adhering the LED lamp layers to a target surface after removing the LED lamp layers from the substrate.

5. The method of claim 1 further comprising adhering the LED lamp layers to a target surface prior to removing the LED lamp layers from the substrate, then removing the LED lamp layers from the substrate.

6. A method of forming an illumination structure comprising:
providing a substrate;
providing a release layer overlying the substrate;
forming a first conductor layer overlying the release layer;
depositing an array of vertical light emitting diodes (VLEDs) over the first conductor layer, the VLEDs having a bottom electrode electrically contacting the first conductor layer;
forming a second conductor layer overlying the VLEDs, the VLEDs having a top electrode electrically contacting the second conductor layer, wherein the first conductor layer, the VLEDs and the second conductor layer comprise flexible LED lamp layers; and
removing the LED lamp layers from the substrate, wherein the release layer provides an adherence between the substrate and the LED lamp layers to allow the LED lamp layers to be separated from the substrate without damage,
wherein the release layer remains adhered to the LED lamp layers after removing the LED lamp layers from the substrate.

7. The method of claim 1 wherein the release layer remains adhered to the substrate after removing the LED lamp layers from the substrate.

8. The method of claim 1 wherein the release layer comprises a varnish.

9. The method of claim 1 wherein the release layer is a thermoplastic.

10. The method of claim 2 wherein a surface of the LED lamp layers opposing the substrate is a bottom surface and a surface of the LED lamp layers facing away from the substrate is a top surface, the method further comprising adhering the bottom surface of the LED lamp layers to a target surface after removing the LED lamp layers from the substrate, wherein light exits the top surface of the LED lamp layers.

11. A method of forming an illumination structure comprising:
providing a substrate;
providing a release layer overlying the substrate;
forming a first conductor layer overlying the release layer;
depositing an array of vertical light emitting diodes (VLEDs) over the first conductor layer, the VLEDs having a bottom electrode electrically contacting the first conductor layer;
forming a second conductor layer overlying the VLEDs, the VLEDs having a top electrode electrically contacting the second conductor layer, wherein the first conductor layer, the VLEDs and the second conductor layer comprise flexible LED lamp layers; and
removing the LED lamp layers from the substrate, wherein the release layer provides an adherence between the substrate and the LED lamp layers to allow the LED lamp layers to be separated from the substrate without damage,
wherein a surface of the LED lamp layers opposing the substrate is a bottom surface and a surface of the LED lamp layers facing away from the substrate is a top surface, the method further comprising adhering the top surface of the LED lamp layers to a target surface after removing the LED lamp layers from the substrate, wherein light exits the bottom surface of the LED lamp layers.

12. The method of claim 1 wherein the substrate and LED lamp layers are flexible.

13. The method of claim 1 wherein the substrate and LED lamp layers are flexible and the steps of forming the first conductor layer, depositing the array of VLEDs over the first conductor layer, and forming the second conductor layer overlying the VLEDs are performed in a roll-to-roll process.

14. A method of forming an illumination structure comprising:
providing a substrate;
providing a release layer overlying the substrate;
forming a first conductor layer overlying the release layer;
depositing an array of vertical light emitting diodes (VLEDs) over the first conductor layer, the VLEDs having a bottom electrode electrically contacting the first conductor layer;
forming a second conductor layer overlying the VLEDs, the VLEDs having a top electrode electrically contacting the second conductor layer, wherein the first conductor layer, the VLEDs and the second conductor layer comprise flexible LED lamp layers; and
removing the LED lamp layers from the substrate, wherein the release layer provides an adherence between the substrate and the LED lamp layers to allow the LED lamp layers to be separated from the substrate without damage,
wherein the substrate and LED lamp layers are flexible and the steps of forming the first conductor layer, depositing the array of VLEDs over the first conductor layer, and forming the second conductor layer overlying the VLEDs are performed in a roll-to-roll process, and wherein the step of removing the LED lamp layers from the substrate is also performed in the roll-to-roll process.

15. The method of claim 1 wherein the step of depositing the array of VLEDs over the first conductor layer comprises printing the array of VLEDs over the first conductor layer.

16. The method of claim 1 wherein the step of removing the LED lamp layers from the substrate comprises peeling the LED lamp layers off the substrate.

17. The method of claim 1 further comprising applying a voltage differential between the first conductor layer and the second conductor layer to illuminate the VLEDs.

18. The method of claim 1 wherein the LED lamp layers are substantially transparent, the method further comprising adhering the LED lamp layers to a target surface such that the target surface is visible through the LED lamp layers.

* * * * *